United States Patent
Nguyen et al.

(10) Patent No.: US 9,634,607 B2
(45) Date of Patent: Apr. 25, 2017

(54) LOW NOISE AND LOW POWER VOLTAGE-CONTROLLED OSCILLATOR (VCO) USING TRANSCONDUCTANCE (GM) DEGENERATION

(71) Applicant: QUALCOMM Incorporated, San Diego, CA (US)

(72) Inventors: Thinh Cat Nguyen, Santa Clara, CA (US); Jeongsik Yang, San Jose, CA (US); Roger Thomas Brockenbrough, Los Gatos, CA (US); Ara Bicakci, Belmont, CA (US); Anup Savla, Santa Clara, CA (US); Shen Wang, Palo Alto, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 278 days.

(21) Appl. No.: 14/204,542

(22) Filed: Mar. 11, 2014

(65) Prior Publication Data

US 2015/0263671 A1    Sep. 17, 2015

(51) Int. Cl.
*H03B 5/12*        (2006.01)
*H04B 1/40*        (2015.01)

(52) U.S. Cl.
CPC ......... *H03B 5/1212* (2013.01); *H03B 5/1215* (2013.01); *H03B 5/1228* (2013.01);
(Continued)

(58) Field of Classification Search
CPC ...... H03B 2200/0038; H03B 2200/009; H03B 5/1212; H03B 5/1215; H03B 5/1228;
(Continued)

(56) References Cited

U.S. PATENT DOCUMENTS

| | | | |
|---|---|---|---|
| 5,920,235 A | | 7/1999 | Beards et al. |
| 6,137,372 A | * | 10/2000 | Welland ................. H03D 7/165 331/1 A |

(Continued)

FOREIGN PATENT DOCUMENTS

| | | |
|---|---|---|
| JP | 2001111341 A | 4/2001 |
| JP | 2008148210 A | 6/2008 |
| WO | WO-2006129405 A1 | 12/2006 |

OTHER PUBLICATIONS

Casha O., et al., "Comparative study of gigahertz CMOS LC quadrature voltage-controlled oscillators with relevance to phase noise", Analog Integrated Circuits and Signal Processing, Kluwer Academic Publishers, BO, vol. 52, No. 1-2, Aug. 22, 2007 (Aug. 22, 2007), pp. 1-14, XP019523207, ISSN: 1573-1979.<span class="Apple-tab-span" style="white-space: pre;">.

(Continued)

*Primary Examiner* — Lewis West
(74) *Attorney, Agent, or Firm* — Patterson & Sheridan, L.L.P.

(57) ABSTRACT

Certain aspects of the present disclosure generally relate to voltage-controlled oscillators (VCOs) using a lowered or an adjustable negative transconductance ($-g_m$) compared to conventional VCOs. This $-g_m$ degeneration technique suppresses the noise injected into an inductor-capacitor (LC) tank of the VCO, thereby providing lower signal-to-noise ratio (SNR) for a given VCO voltage swing, lower power consumption, and decreased phase noise. One example VCO generally includes a resonant tank circuit, an active negative transconductance circuit connected with the resonant tank circuit, and a bias current circuit for sourcing or sinking a bias current through the resonant tank circuit and the active negative transconductance circuit to generate an oscillating signal. The active negative transconductance circuit includes (Continued)

cross-coupled transistors and an impedance connected between the cross-coupled transistors and a reference voltage.

21 Claims, 8 Drawing Sheets

(52) U.S. Cl.
CPC ......... *H03B 5/1237* (2013.01); *H03B 5/1262* (2013.01); *H03B 5/1278* (2013.01); *H03B 5/1287* (2013.01); *H04B 1/40* (2013.01); *H03B 2200/009* (2013.01); *H03B 2200/0038* (2013.01)

(58) Field of Classification Search
CPC .. H03B 5/1237; H03B 5/1262; H03B 5/1278; H03B 5/1287; H04B 1/40
See application file for complete search history.

(56) References Cited

U.S. PATENT DOCUMENTS

| | | | |
|---|---|---|---|
| 6,765,448 B2 | 7/2004 | Wu | |
| 7,054,344 B1* | 5/2006 | Nguyen | H01S 5/042 372/38.02 |
| 7,227,423 B2 | 6/2007 | McCorquodale | |
| 7,342,462 B1 | 3/2008 | Chen | |
| 2004/0183606 A1* | 9/2004 | Komurasaki | H03B 5/1847 331/117 R |
| 2005/0206462 A1* | 9/2005 | McCorquodale | H03B 5/04 331/57 |
| 2006/0145762 A1* | 7/2006 | Leete | H03F 3/195 330/254 |
| 2009/0066431 A1* | 3/2009 | Shin | H03B 5/1852 331/117 FE |
| 2011/0074513 A1 | 3/2011 | Bao | |
| 2011/0215875 A1* | 9/2011 | Yagishita | H03L 7/00 331/34 |
| 2012/0249250 A1* | 10/2012 | Cheng | H03B 27/00 331/45 |
| 2012/0286889 A1* | 11/2012 | Park | H03B 5/1212 331/117 FE |

OTHER PUBLICATIONS

International Search Report and Written Opinion—PCT/US2015/016900—ISA/EPO—Jul. 23, 2015.
Partial International Search Report—PCT/US2015/016900—ISA/EPO—May 4, 2015.
Safarian Z., et al., "A 1.3a 6 GHz triple-mode CMOS VCO using coupled inductors" Custom Integrated Circuits Conference, 2008. CICC 2008. IEEE, IEEE, Piscataway, NJ, USA, Sep. 21, 2008 (Sep. 21, 2008), pp. 69-72, XP031361414 ISBN: 978-1-4244-2018-6 the whole document.

* cited by examiner

LOW NOISE AND LOW POWER VOLTAGE-CONTROLLED OSCILLATOR (VCO) USING TRANSCONDUCTANCE (GM) DEGENERATION

TECHNICAL FIELD

Certain aspects of the present disclosure generally relate to electronic circuits and, more particularly, to voltage-controlled oscillator (VCO) circuits with a lowered or an adjustable negative transconductance.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to voltage-controlled oscillators (VCOs) using a lowered or an adjustable negative transconductance ($-g_m$) compared to conventional VCOs. This $-g_m$ degeneration technique suppresses the noise injected into an inductor-capacitor (LC) tank of the VCO, thereby providing lower signal-to-noise ratio (SNR) for a given VCO voltage swing, lower power consumption, and decreased phase noise.

Certain aspects of the present disclosure provide a VCO. The VCO generally includes a resonant tank circuit, an active negative transconductance circuit connected with the resonant tank circuit, and a bias current circuit for sourcing or sinking a bias current through the resonant tank circuit and the active negative transconductance circuit to generate an oscillating signal. The active negative transconductance circuit includes cross-coupled transistors and an impedance connected between the cross-coupled transistors and a reference voltage.

According to certain aspects, the VCO may further include a switch configured to programmably shunt the impedance. For certain aspects, the switch may include a transistor.

According to certain aspects, the cross-coupled transistors may include n-channel metal oxide semiconductor field effect transistors (nMOSFETs, also known as NMOS transistors). For certain aspects, a body of each of the cross-coupled transistors is connected with the reference voltage.

According to certain aspects, the impedance is a variable impedance.

According to certain aspects, the impedance is a resistor.

According to certain aspects, the impedance includes an inductor.

According to certain aspects, the active negative transconductance circuit has a variable transconductance. The variable transconductance may be adjusted by varying the effective size of transistors in the active negative transconductance circuit.

According to certain aspects, the cross-coupled transistors include cross-coupled p-channel metal oxide semiconductor field effect transistors (pMOSFETs, also known as PMOS transistors) and cross-coupled NMOS transistors. In this case, the impedance (i.e., a first impedance) may be connected between the NMOS transistors and the reference voltage. For certain aspects, another impedance (i.e., a second impedance) may be connected between the PMOS transistors and the bias current circuit. For certain aspects, the VCO may further include at least one switch configured to programmably shunt at least one of the impedance (i.e., the first impedance) or the other impedance (i.e., the second impedance).

According to certain aspects, the bias current circuit includes a current mirror.

According to certain aspects, the resonant tank circuit includes an inductor-capacitor (LC) tank circuit.

According to certain aspects, the reference voltage is an electrical ground.

Certain aspects of the present disclosure provide a VCO. The VCO generally includes a resonant tank circuit, an active negative transconductance circuit connected with the resonant tank circuit and having a variable transconductance, and a bias current circuit for sourcing or sinking a bias current through the resonant tank circuit and the active negative transconductance circuit to generate an oscillating signal.

According to certain aspects, the variable transconductance is adjusted by varying the effective size of transistors in the active negative transconductance circuit.

According to certain aspects, the active negative transconductance circuit comprises cross-coupled transistors. The transistors may include NMOS field effect transistors for certain aspects. For other aspects, the cross-coupled transistors include cross-coupled PMOS transistors and cross-coupled NMOS transistors. For certain aspects, at least one of a body or a source of each of the transistors is connected with a reference voltage (e.g., an electrical ground).

According to certain aspects, the bias current circuit includes a current mirror.

According to certain aspects, the resonant tank circuit is an LC tank circuit.

Certain aspects of the present disclosure provide an apparatus for wireless communications. The apparatus includes at least one antenna and at least one of a receiver configured to receive, or a transmitter configured to send, a radio frequency (RF) signal via the at least one antenna. The at least one of the receiver or the transmitter has a VCO that generally includes a resonant tank circuit, an active negative transconductance circuit connected with the resonant tank circuit, and a bias current circuit for sourcing or sinking a bias current through the resonant tank circuit and the active negative transconductance circuit to generate an oscillating signal. The active negative transconductance circuit includes cross-coupled transistors and an impedance connected between the cross-coupled transistors and a reference voltage.

According to certain aspects, the VCO may further include a switch configured to programmably shunt the impedance. For certain aspects, the switch may include a transistor.

According to certain aspects, the active negative transconductance circuit has a variable transconductance adjusted by varying the effective size of transistors in the active negative transconductance circuit.

According to certain aspects, a body of each of the cross-coupled transistors is connected with the reference voltage.

Certain aspects of the present disclosure provide an apparatus for wireless communications. The apparatus includes at least one antenna and at least one of a receiver configured to receive, or a transmitter configured to send, an RF signal via the at least one antenna. The at least one of the receiver or the transmitter has a VCO that generally includes a resonant tank circuit, an active negative transconductance circuit connected with the resonant tank circuit and having a variable transconductance, and a bias current circuit for sourcing or sinking a bias current through the resonant tank circuit and the active negative transconductance circuit to generate an oscillating signal.

According to certain aspects, the variable transconductance is adjusted by varying the effective size of transistors in the active negative transconductance circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement GSM or some other standards. These various standards are known in the art.

An Example Wireless System

Figure 1:
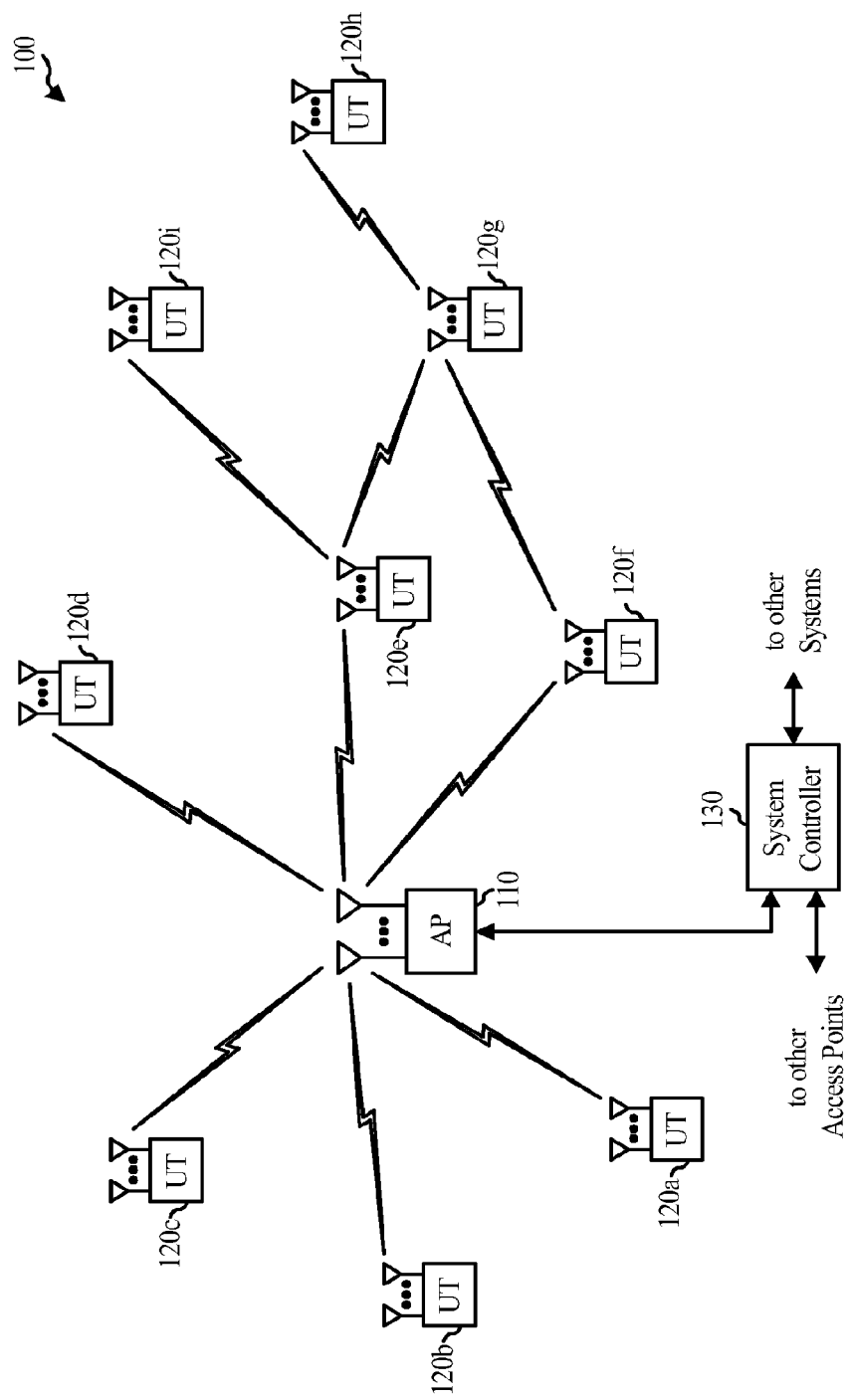
FIG. 1 is a diagram of an example wireless communications network in accordance with certain aspects of the present disclosure.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
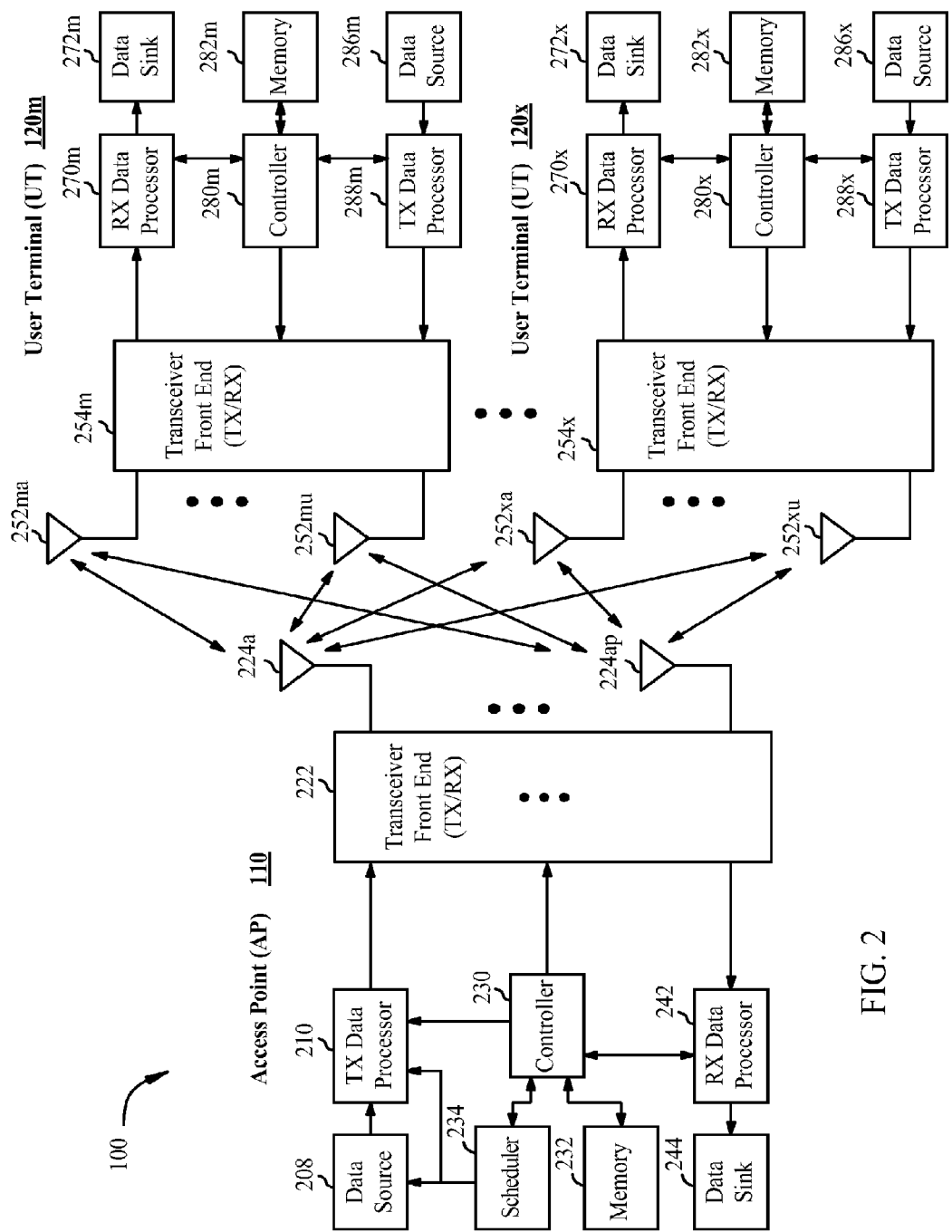
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222.

At each user terminal 120, $N_{ut,n}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes)

the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, and combinations thereof.

Example Voltage-Controlled Oscillator

A local oscillator (LO) is typically included in radio frequency front-ends (RFFEs) to generate a signal utilized to convert a signal of interest to a different frequency using a mixer. Known as heterodyning, this frequency conversion process produces the sum and difference frequencies of the LO frequency and the frequency of the signal of interest. The sum and difference frequencies are referred to as the beat frequencies. While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range.

In a modern communication system (e.g., a WLAN), an ideal VCO should not only have low noise, but it should also operate at low voltage, consume less power, and cover a wide frequency range. To reduce phase noise, the VCO designer can either lower the noise floor or increase the VCO voltage-swing level to achieve higher signal-to-noise ratio (SNR). Most conventional designs raise the SNR by increasing the VCO voltage swing with higher current, higher supply voltages, and the use of a high threshold-voltage device (to allow higher voltage swing). The power consumption therefore is unavoidably higher. Since high voltage devices commonly have lower speed (unity frequency), these approaches are typically limited to lower frequency VCO designs.

Certain aspects of the present disclosure provide a VCO that overcomes these drawbacks. Low voltage metal-oxide-semiconductor (MOS) devices still can be used to support higher speed operation. However, instead of reducing phase noise (and increasing SNR) with higher voltage swing, certain aspects of the present disclosure focus on a technique to suppress the noise injected into the inductor-capacitor (LC) tank. This provides lower SNR for a given voltage swing, and therefore lower power consumption.

Figure 3:
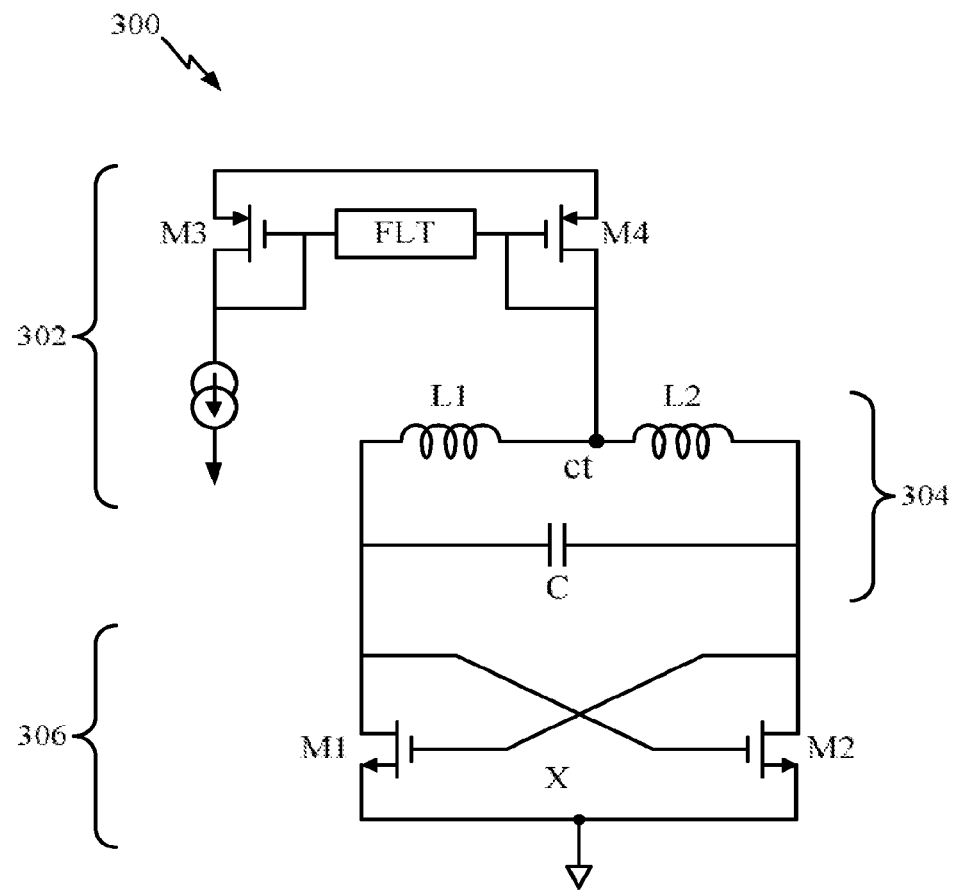
FIG. 3 is an example schematic of a voltage-controlled oscillator (VCO) using an inductor-capacitor (LC) tank, in accordance with certain aspects of the present disclosure.

FIG. 3 is a schematic of a typical VCO 300 having a resonant tank circuit 304 (here, an LC tank), an active negative transconductance ($-g_m$) circuit 306 connected with the resonant tank circuit, and a bias current circuit 302 for sourcing (or sinking) a bias current through the resonant tank circuit 304 and the active negative transconductance circuit 306 to generate an oscillating signal. As illustrated in FIG. 3, a pair of NMOS devices labeled M1 and M2 are cross-coupled to form the active negative transconductance circuit 306 that serves to cancel out the loss (due to parasitics) of the resonant tank circuit 304 and, thus, to sustain the oscillation mechanism. The resonant tank circuit 304 may include two inductors L1 and L2 (or a center-tapped inductor) and a capacitor C designed to oscillate at a certain resonance frequency. The bias current circuit 302 may include a current source in a current mirror topology formed using a pair of PMOS devices labeled M3 and M4, where the current mirror functions to source a current to the resonant tank circuit 304 that is equivalent to the current source's current. As illustrated in FIG. 3, there may be a filter labeled FLT (e.g., a low pass RC filter) between the pair of PMOS devices M3, M4, designed to block noise in the bias branch of the current mirror from reaching the resonant tank circuit 304.

There have been many designs attempting to reduce VCO phase noise, and thereby increase SNR. As briefly mentioned above, one of the most conventional techniques to raise SNR is to increase VCO voltage swing. In order to increase SNR, the conventional approach is to increase voltage swing by applying more current flowing into the resonant tank. However, increasing current also increases gain ($g_m$) of the NMOS device. It follows that the device's noise is also amplified and is unavoidably injected into the tank. Since the swing increase is linearly proportional to the increased current amount while the noise increase is approximately proportional to the square root, there is some modest improvement in overall SNR. However, for a given voltage swing (corresponding to a given current used), this SNR improvement method is not considered to be very efficient.

Figure 4B:
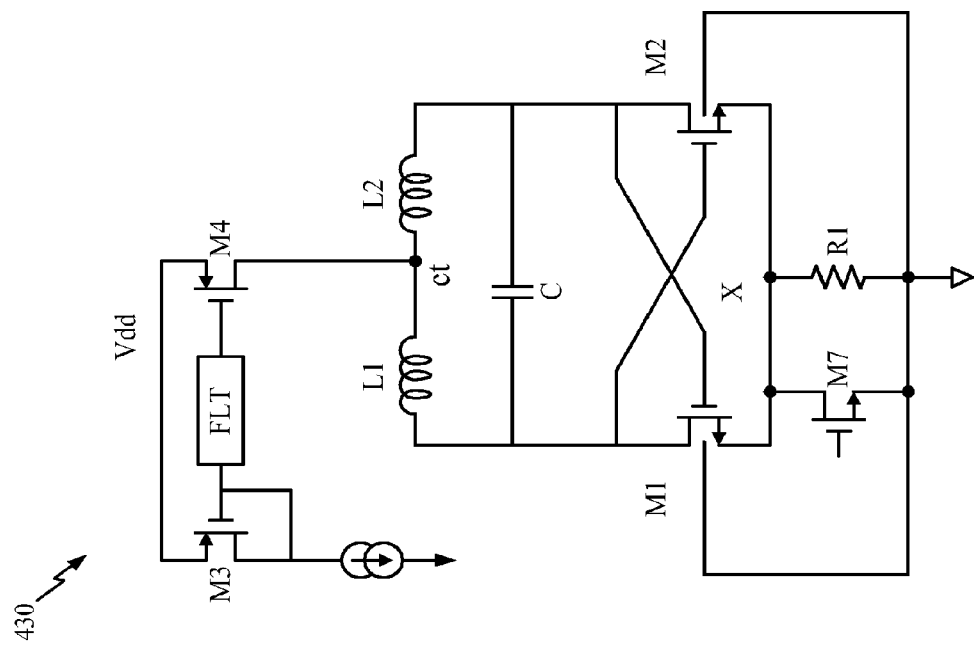
FIG. 4B is a schematic of an example VCO using a tail resistor to lower the transconductance and a switch to programmably shunt the tail resistor, in accordance with certain aspects of the present disclosure.
Figure 4A:
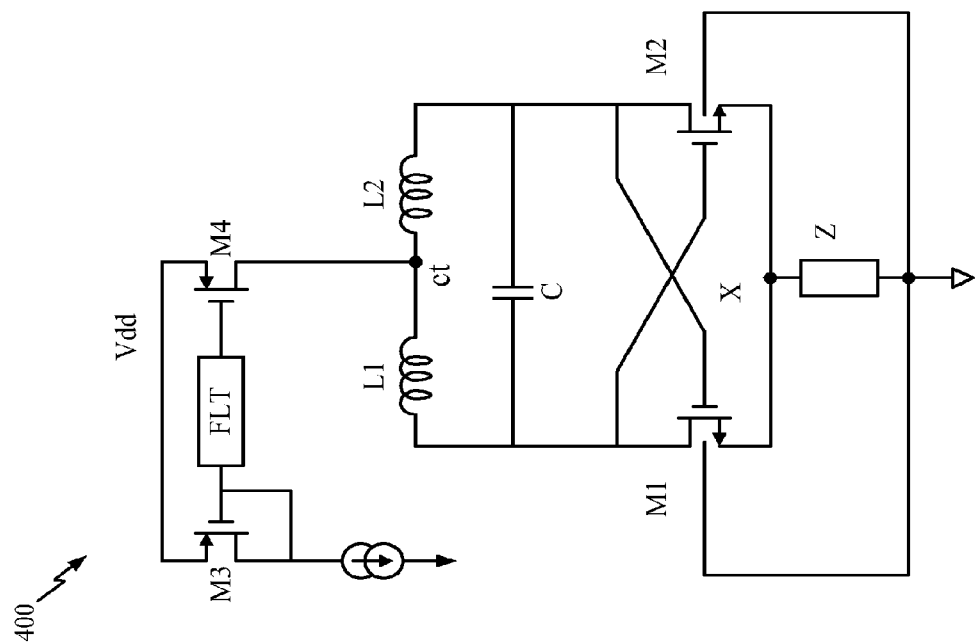
FIG. 4A is a schematic of an example VCO using a tail impedance to lower the transconductance, in accordance with certain aspects of the present disclosure.

Certain aspects of the present disclosure reduce the noise contribution of the active negative transconductance circuit injected into the resonant tank at the same voltage-swing level. FIG. 4A is a schematic diagram of one example implementation of a VCO 400, in accordance with aspects of the present disclosure. Here, the active negative transconductance circuit 306 includes the two cross-coupled NMOS transistors M1, M2, as well as a tail impedance Z inserted between node X and a reference voltage node (e.g., electrical ground labeled "gnd"). The bulk connections of NMOS devices M1 and M2 may be connected separately to a node having a lower potential node than node X, the lower potential node being ground in this case.

The impedance Z may consist of any suitable combination of passive circuit components (e.g., resistors, inductors, and capacitors) to achieve the desired impedance Z. The impedance Z may have only a resistance value (i.e., zero reactance) and, for certain aspects, may be a single tail resistor R1, as illustrated in the example VCO 430 of FIG. 4B. For certain aspects, the impedance Z may have a switch configured to programmably shunt (i.e., short circuit) node X to ground. As illustrated in FIG. 4B, NMOS device M7 functions as such a bypass switch (i.e., a shunt) and may be turned on or off by setting M7's gate at logic high or low, respectively. M7 is typically turned off during low-noise operation. For certain aspects, the impedance Z may be a variable impedance, as illustrated in the example VCO 460 of FIG. 4C. In this case, any one or more of the various passive circuit components may be capable of being varied, such that the overall impedance Z is adjustable.

When the VCO fully oscillates, the signal swing on each NMOS device M1, M2 is relatively large. The tail impedance Z (e.g., resistor R1) and one of the NMOS devices form a common-mode amplifier with a source degeneration configuration, and the amplifier's effective $g_m$ now becomes smaller. This is equivalent to replacing the NMOS device with a lower $g_m$ device. The degenerated amplifier now has lower $g_m$, and the amount of noise injected into the resonant tank circuit 304 is reduced. Because the VCO voltage swing still remains the same while the injected noise is now reduced, the SNR is therefore increased. During VCO small signal start-up mode, NMOS devices M1 and M2 "see" node X from impedance Z as a virtual ground. There is no degradation in the small signal loop-gain, and this is still sufficient to guarantee the VCO to start up.

In the VCO 430 of FIG. 4B, since the current in current-mirror device M4 flows through resistor R1, this current generates an IR (current*resistance) voltage drop at node X. This elevates the sources of devices M1 and M2 to a higher potential. Since M1's bulk terminal and M2's bulk terminal are connected to ground, these transistors experience body effect, which increases their threshold voltages ($V_{TH}$). This has certain benefits. For example, M1 and M2 now have higher $V_{GS}$ for the same amount of current, and this provides an advantage of extra headroom for voltage swing before the devices enter the triode region. Note that higher $V_{GS}$ means the source potential of the device becomes relatively lower compared to its drain potential. This allows the drain's potential to have more headroom to travel down further without entering the triode region. When the drain voltage enters the triode region, the resonant tank circuit sees low impedance, which degrades the tank quality factor (Q) and subsequently degrades the SNR. As another benefit, because the NMOS devices' drains are elevated higher than before, this allows larger swing to travel toward ground without the parasitic bulk-to-drain diode being turned on. If this parasitic diode is turned on, the tank Q will be degraded, and so, too, will the SNR.

Figure 4D:
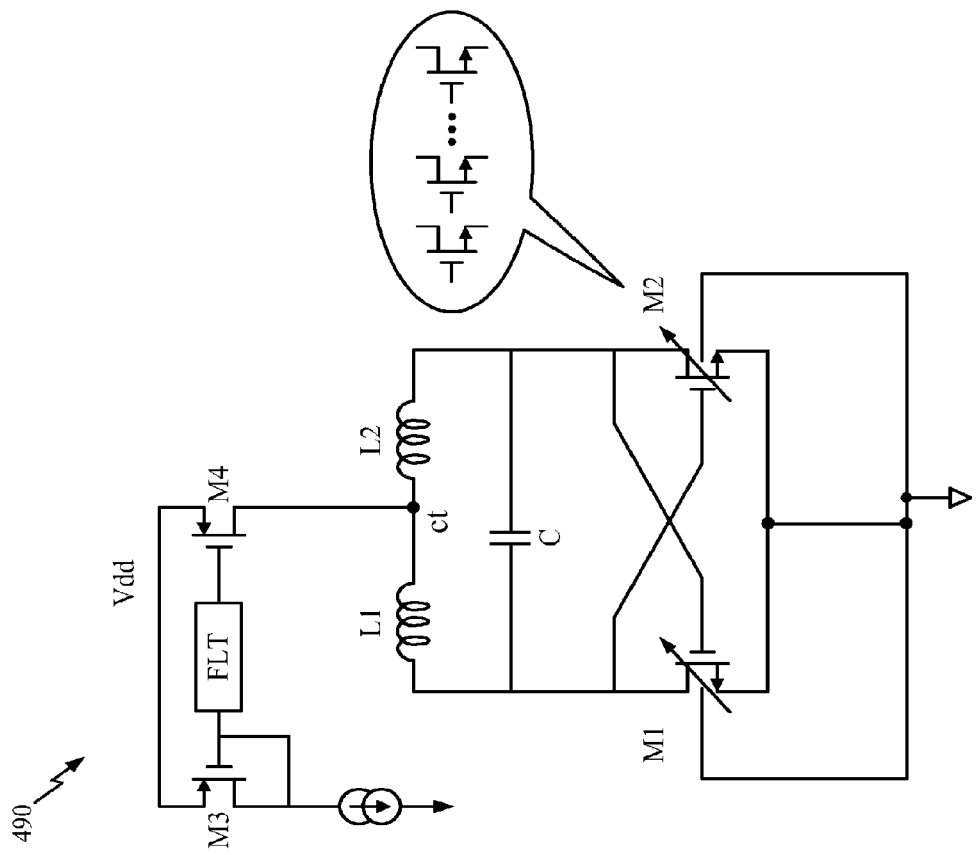
FIG. 4D is a schematic of an example VCO using a variable active negative transconductance circuit, in accordance with certain aspects of the present disclosure.

According to certain aspects, the transconductance may be varied by varying the effective size of the cross-coupled transistors in the active negative transconductance circuit 306. FIG. 4D is a schematic diagram of an example VCO 490 using such a variable active negative transconductance circuit, in accordance with certain aspects of the present disclosure. In VCO 490, devices M1 and M2 may be variable NMOS devices. For certain aspects, this variable transconductance scheme may be combined with the tail impedance Z described above.

For certain applications, such as IEEE 802.11a/ac, the operating frequency is relatively quite wide. The VCO is designed to cover the highest frequency, which is 20% higher than the lowest frequency. The desired phase noise is most difficult to achieve at the highest frequency. To obtain low noise operation, the VCO $-g_m$ may be designed to be as low as possible. However, lower $-g_m$ may pose an issue at lower frequencies where the VCO demands higher transconductance to guarantee the VCO has sufficient start-up gain. If the VCO $-g_m$ is designed to have a high value to accommodate the VCO demands at the low frequency end, this transconductance may unnecessarily inject excessive noise into the LC tank at the high frequency end. The constraints of VCO transconductance design at the two frequency extremes are therefore in opposition.

Despite these opposing constraints, certain aspects of the present disclosure are suitable for this wideband situation. At higher frequencies within the operating band, the $-g_m$ is reduced with the presence of the degeneration impedance (e.g., tail resistor R1) to achieve lowered phase noise. At lower frequencies, the LC tank impedance is lower, and this reduces the VCO start-up gain. To compensate for low gain, the VCO transconductance should be boosted higher with the use of higher tail current, for example. This current may entail higher headroom. If desired, M7 may be switched on to shunt R1 and provide extra headroom. Because the phase noise is linearly proportional to frequency (according to Leeson's equation), at lower frequencies with R1 being shunted, the phase noise level may still be acceptable.

Figure 5A:
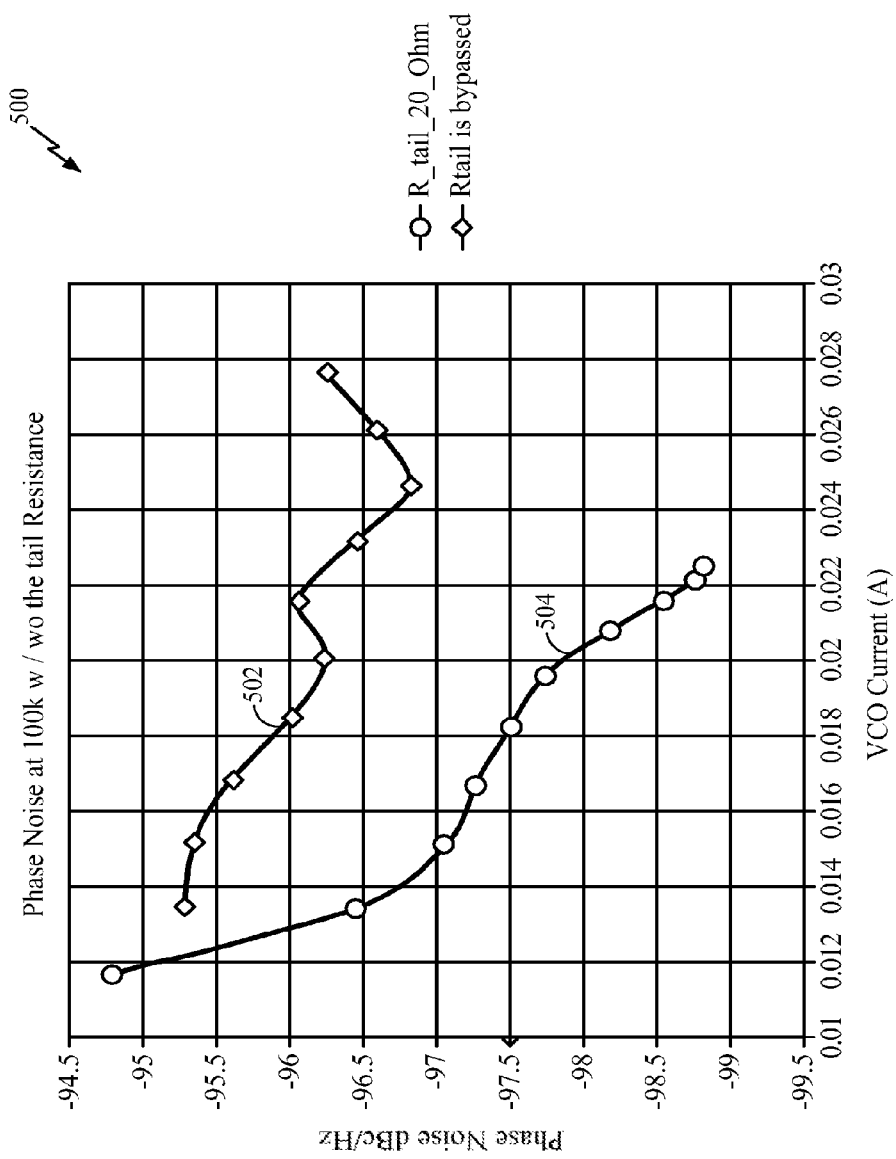
FIG. 5A is an example graph of phase noise versus VCO current, comparing VCOs with and without a tail resistor, in accordance with certain aspects of the present disclosure.

FIG. 5A is an example graph 500 of phase noise in dBc/Hz at 100 kHz versus VCO current in amperes (A), comparing two different VCOs operating at 9 GHz. Trace 502 illustrates the phase noise for a conventional VCO without a tail impedance (or where the tail impedance is bypassed), while trace 504 illustrates the phase noise for a VCO with a tail resistance of 20Ω (such as the VCO of FIG. 4B). As shown in the graph 500, the conventional VCO has a limit of about −96.5 dBc/Hz, whereas the VCO with the tail resistance may have a phase noise reduced to −99 dBc/Hz. Also, for a given phase noise level of −96.5 dBc/Hz, the VCO with the tail resistance in trace 504 consumes approximately half the current of the conventional VCO in trace 502 (i.e., 13 mA versus 23 mA).

Figure 5B:
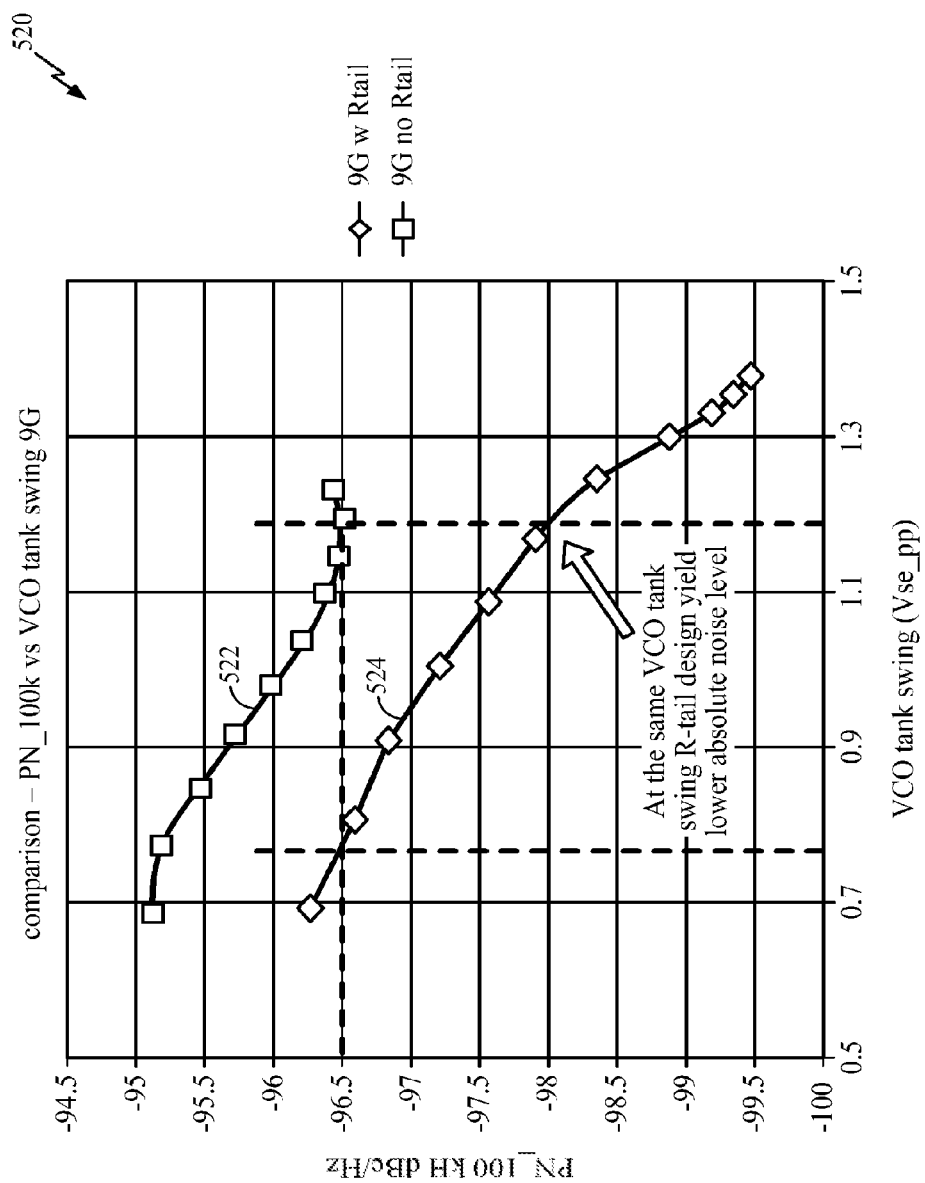
FIG. 5B is an example graph of phase noise versus VCO voltage swing, comparing VCOs with and without a tail resistor, in accordance with certain aspects of the present disclosure.

FIG. 5B is an example graph 520 of phase noise in dBc/Hz at 100 kHz versus VCO voltage swing in peak-to-peak volts (Vpp), comparing two different VCOs operating at 9 GHz. Trace 522 illustrates the phase noise for a conventional VCO without a tail impedance (or where the tail impedance is bypassed), while trace 524 illustrates the phase noise for a VCO with a tail resistance of 20Ω (such as the VCO of FIG. 4B). As depicted in the graph 520 for any given voltage swing, the VCO with the tail resistance has significantly lower phase noise than the conventional VCO. For example, at 1.2 Vpp the phase noise of the conventional VCO is −96.5 dBc/Hz, whereas the VCO with the tail resistance has a phase noise of −98 dBc/Hz.

Figure 4C:
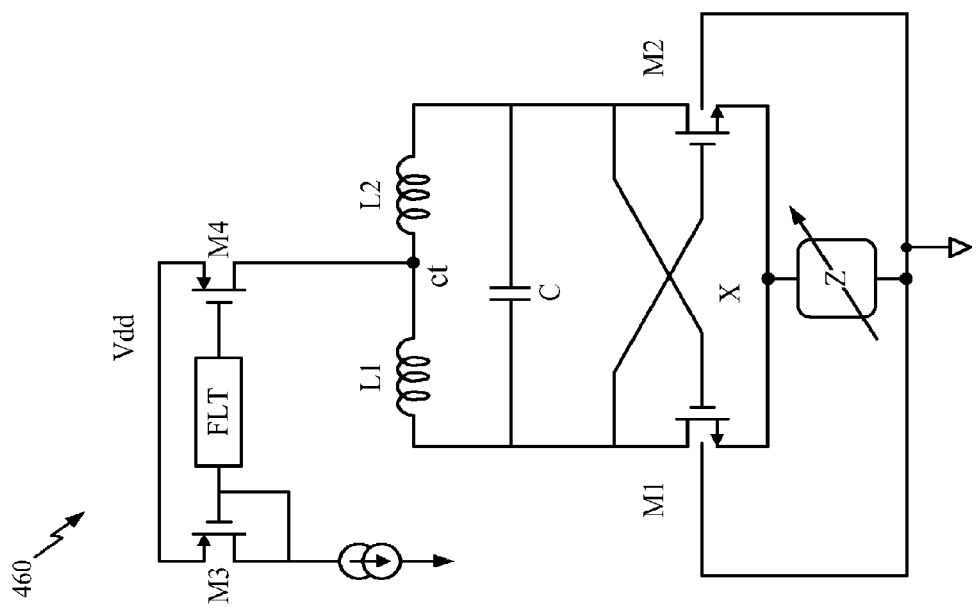
FIG. 4C is a schematic of an example VCO using a variable tail impedance to adjust the transconductance, in accordance with certain aspects of the present disclosure.
Figure 6:
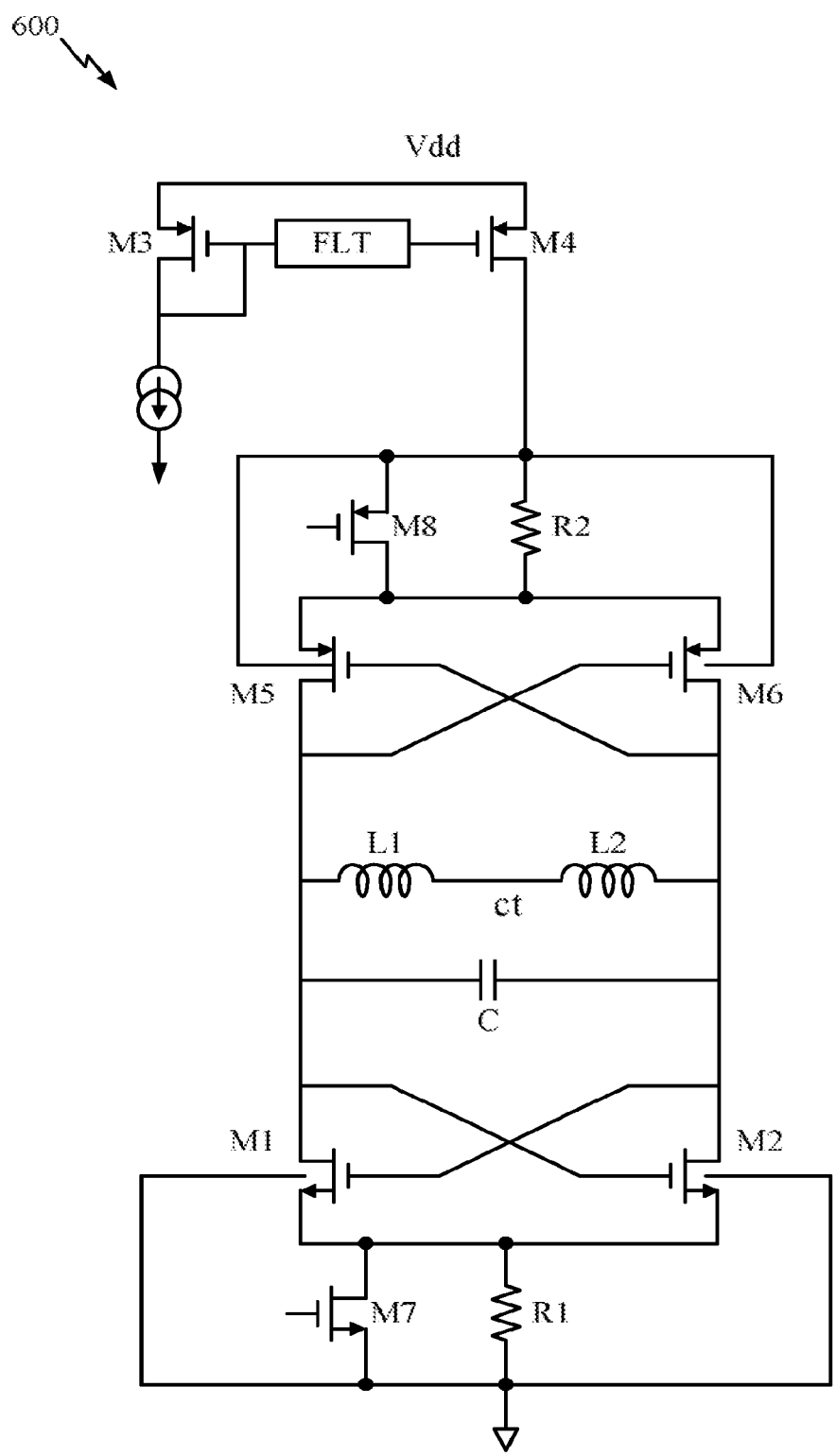
FIG. 6 is a schematic of an example VCO using a complementary metal-oxide-semiconductor (CMOS) active negative transconductance circuit with two resistors to lower the transconductance and two switches to programmably shunt the resistors, in accordance with certain aspects of the present disclosure.

FIG. 6 is a schematic of an example VCO 600 using a complementary metal-oxide-semiconductor (CMOS) active negative transconductance circuit, in accordance with certain aspects of the present disclosure. The CMOS active negative transconductance circuit includes cross-coupled NMOS devices M1 and M2 as described above, as well as cross-coupled PMOS devices M5 and M6 disposed between the bias current circuit 302 and the resonant tank circuit 304. The bulk nodes of the NMOS devices M1 and M2 are connected to ground, while the bulk nodes of the PMOS devices M5 and M6 are connected with the common local Vdd, which is at the output of the current mirror. The tail impedance concept of FIGS. 4A-C is also applied here, with a tail resistor R1 for the NMOS devices and a tail resistor R2 connected between the PMOS devices and the common local Vdd, as illustrated in FIG. 6. The tail impedance(s) may also be coupled with bypass switches M7 and/or M8 to programmably shunt the tail impedance(s), as described above. Because the current in a CMOS $-g_m$ circuit can be almost half that of an NMOS $-g_m$ circuit for the same voltage swing, the use of CMOS for certain aspects of the present disclosure results in a very desirable performance of low noise and low power.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A voltage controlled oscillator (VCO), comprising:
   a resonant tank circuit;
   an active negative transconductance circuit connected with the resonant tank circuit, comprising:
     cross-coupled transistors having drains connected with the resonant tank circuit; and
     an impedance connected between sources of the cross-coupled transistors and a reference voltage; and
   a bias current circuit for sourcing or sinking a bias current through the resonant tank circuit and the active negative transconductance circuit to generate an oscillating signal.

2. The VCO of claim 1, further comprising a switch configured to programmably shunt the impedance.

3. The VCO of claim 1, wherein the cross-coupled transistors comprise n-channel metal oxide semiconductor (NMOS) field effect transistors.

4. The VCO of claim 1, wherein a body of each of the cross-coupled transistors is connected with the reference voltage.

5. The VCO of claim 1, wherein the impedance comprises a variable impedance.

6. The VCO of claim 1, wherein the impedance is a resistor.

7. The VCO of claim 1, wherein the impedance comprises an inductor.

8. The VCO of claim 1, wherein the active negative transconductance circuit has a variable transconductance.

9. The VCO of claim 8, wherein the variable transconductance is adjusted by varying the effective size of transistors in the active negative transconductance circuit.

10. The VCO of claim 1, wherein the cross-coupled transistors comprise cross-coupled p-channel metal oxide semiconductor (PMOS) field effect transistors and cross-coupled n-channel metal oxide semiconductor (NMOS) field effect transistors.

11. The VCO of claim 10, wherein the impedance is connected between the NMOS transistors and the reference voltage.

12. The VCO of claim 11, wherein another impedance is connected between the PMOS transistors and the bias current circuit.

13. The VCO of claim 12, further comprising at least one switch configured to programmably shunt at least one of the impedance or the other impedance.

14. The VCO of claim 12, wherein drains of the PMOS transistors are connected with the resonant tank circuit and wherein the other impedance is connected between sources of the PMOS transistors and the bias current circuit.

15. The VCO of claim 1, wherein the bias current circuit comprises a current mirror.

16. The VCO of claim 1, wherein the resonant tank circuit comprises an inductor-capacitor (LC) tank circuit.

17. The VCO of claim 1, wherein the reference voltage is an electrical ground.

18. An apparatus for wireless communications, comprising:
  at least one antenna; and
  at least one of a receiver configured to receive, or a transmitter configured to send, a radio frequency (RF) signal via the at least one antenna, the at least one of the receiver or the transmitter having a voltage controlled oscillator (VCO) comprising:
    a resonant tank circuit;
    an active negative transconductance circuit connected with the resonant tank circuit, comprising:
      cross-coupled transistors having drains connected with the resonant tank circuit; and
      an impedance connected between sources of the cross-coupled transistors and a reference voltage; and
    a bias current circuit for sourcing or sinking a bias current through the resonant tank circuit and the active negative transconductance circuit to generate an oscillating signal.

19. The apparatus of claim 18, wherein the VCO further comprises a switch configured to programmably shunt the impedance.

20. The apparatus of claim 18, wherein the active negative transconductance circuit has a variable transconductance adjusted by varying the effective size of transistors in the active negative transconductance circuit.

21. The apparatus of claim 18, wherein a body of each of the cross-coupled transistors is connected with the reference voltage.

* * * * *